United States Patent
Xing et al.

(10) Patent No.: US 12,471,208 B2
(45) Date of Patent: Nov. 11, 2025

(54) PRINTED CIRCUIT BOARD, DISPLAY MODULE AND DRIVING METHOD THEREOF, AND DISPLAY DEVICE

(71) Applicants: HEFEI XINSHENG OPTOELECTRONICS TECHNOLOGY CO., LTD., Anhui (CN); BOE Technology Group Co., Ltd., Beijing (CN)

(72) Inventors: Zhenzhou Xing, Beijing (CN); Xuanxuan Qiao, Beijing (CN); Rui Wang, Beijing (CN); Jianjun Wang, Beijing (CN); Tao Liu, Beijing (CN)

(73) Assignees: HEFEI XINSHENG OPTOELECTRONICS TECHNOLOGY CO., LTD., Anhui (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 18/022,922

(22) PCT Filed: May 26, 2022

(86) PCT No.: PCT/CN2022/095204
§ 371 (c)(1),
(2) Date: Feb. 23, 2023

(87) PCT Pub. No.: WO2023/225934
PCT Pub. Date: Nov. 30, 2023

(65) Prior Publication Data
US 2024/0276635 A1    Aug. 15, 2024

(51) Int. Cl.
*H05K 1/02* (2006.01)
*G09G 3/36* (2006.01)
*H05K 1/18* (2006.01)

(52) U.S. Cl.
CPC ......... *H05K 1/0259* (2013.01); *G09G 3/3648* (2013.01); *H05K 1/18* (2013.01);
(Continued)

(58) Field of Classification Search
None
See application file for complete search history.

(56) References Cited

U.S. PATENT DOCUMENTS 6,617,521 B1 *  9/2003  Saito ................. H05K 3/323
                                                          439/55
2008/0165301 A1  7/2008  Chang et al.
(Continued)

FOREIGN PATENT DOCUMENTS

CN        103137056 A      6/2013
CN        107275235 A  * 10/2017  ............. H05K 3/282
(Continued)

*Primary Examiner* — Krystal Robinson
(74) *Attorney, Agent, or Firm* — WHDA, LLP (57) ABSTRACT

Disclosed are a printed circuit board, a display module and a driving method thereof, and a display device. The printed circuit board includes a blank area and an encapsulation area. The printed circuit board includes a first metal layer including a first metal pattern and a second metal pattern separated from each other, a first pad connected to the first metal pattern, and a second pad connected to the second metal pattern. The first metal pattern is located in the blank area, and the second metal pattern is located in the encapsulation area. The first pad and the second pad are configured to be connected to an electrostatic isolation device, and the second metal pattern is configured to be connected to a functional electronic device.

17 Claims, 8 Drawing Sheets

(52) U.S. Cl.
CPC ..... *G09G 2330/04* (2013.01); *G09G 2330/06* (2013.01); *H05K 2201/10128* (2013.01)

(56) References Cited

U.S. PATENT DOCUMENTS

2010/0109153 A1\* 5/2010 Setiadi ................ H01L 25/0657
257/713
2023/0067995 A1 3/2023 Liu et al.

FOREIGN PATENT DOCUMENTS

| CN | 211857976 U |   | 11/2020 |            |
|----|-------------|---|---------|------------|
| CN | 112164690 A |   | 1/2021  |            |
| CN | 112292916 A |   | 1/2021  |            |
| CN | 214098387 U | * | 8/2021  |            |
| CN | 116456582 A | * | 7/2023  | ........... G09G 3/3208 |
| JP | H02-34818 A |   | 2/1990  |            |
| TW | 201509250 A |   | 3/2015  |            |

\* cited by examiner

PRINTED CIRCUIT BOARD, DISPLAY MODULE AND DRIVING METHOD THEREOF, AND DISPLAY DEVICE

TECHNICAL FIELD

The present disclosure relates to the field of display technology, and in particular, to a printed circuit board, a display module and a driving method thereof, and a display device.

BACKGROUND

Static electricity is an objective natural phenomenon, which is generated by contact, friction and induction between electric appliances and so on. Static electricity often causes unstable operation and even damage to electronic devices.

SUMMARY

The present disclosure provides a printed circuit board including a blank area and an encapsulation area, and the printed circuit board includes a first metal layer, the first metal layer includes: a first metal pattern and a second metal pattern separated from each other; a first pad connected to the first metal pattern; and a second pad connected to the second metal pattern; the first metal pattern is located in the blank area, and the second metal pattern is located in the encapsulation area; the first pad and the second pad are configured to be connected to an electrostatic isolation device, and the second metal pattern is configured to be connected to a functional electronic device.

In an optional implementation, the first pad and the second pad are both located in the encapsulation area.

In an optional implementation, the blank area is separated from the encapsulation area by a boundary area, and the first pad is arranged at a position, in the encapsulation area, close to the boundary area to shorten a charge transfer path between the first metal pattern and the first pad.

In an optional implementation, the first pad is located in the blank area, and the second pad is located in the encapsulation area.

In an optional implementation, the blank area is separated from the encapsulation area by a boundary area, the first pad is arranged at a position, in the blank area, close to the boundary area, and the second pad is arranged at a position, in the encapsulation area, close to the boundary area.

In an optional implementation, the first pad and the second pad are both located in the blank area.

In an optional implementation, the first metal layer further includes:
  a first metal wire connected between the first metal pattern and the first pad, the first metal pattern, the first pad and the first metal wire forming an integrated structure; and
  a second metal wire connected between the second metal pattern and the second pad, the second metal pattern, the second pad and the second metal wire forming an integrated structure.

In an optional implementation, the electrostatic isolation device includes a plurality of electronic elements; the first pad includes a plurality of first sub-pads, and the plurality of first sub-pads are configured to be connected to first ends of different electronic elements, respectively; the plurality of first sub-pads are connected to each other, and the plurality of first sub-pads are connected to the first metal pattern through a same first metal wire; or, the plurality of first sub-pads are separated from each other, and the plurality of first sub-pads are connected to the first metal pattern through different first metal wires, respectively.

In an optional implementation, the electrostatic isolation device includes a plurality of electronic elements; the second pad includes a plurality of second sub-pads, and the plurality of second sub-pads are configured to be connected to second ends of different electronic elements, respectively; the plurality of second sub-pads are connected to each other, and the plurality of second sub-pads are connected to the second metal pattern through a same second metal wire; or, the plurality of second sub-pads are separated from each other, and the plurality of the second sub-pads are connected to the second metal pattern through different second metal wires, respectively.

In an optional implementation, the electrostatic isolation device includes one of the following electronic elements or more than one of the following electronic elements connected in parallel; a capacitor, a resistor, and a magnetic bead.

In an optional implementation, a size of the first metal pattern is greater than or equal to 5 mm and less than or equal to 15 mm in a plane where the first metal layer is located.

In an optional implementation, the first metal layer includes a plurality of first metal patterns, a plurality of first pads and a plurality of second pads; the plurality of first metal patterns and the second metal pattern are separated from each other; the plurality of first metal patterns are correspondingly connected to different first pads, respectively; the second pads are arranged in correspondence with the first pads, and a second pad and a first pad that are arranged in correspondence are connected to the same electrostatic isolation device.

In an optional implementation, the first metal layer comprises two first metal patterns, the two first metal patterns are both arranged close to a first side edge of the printed circuit board, and the two first metal patterns are also arranged close to a second side edge and a third side edge of the printed circuit board, respectively; the second side edge and the third side edge are oppositely arranged, and both perpendicular to the first side edge.

In an optional implementation, the printed circuit further comprises:
  an insulation layer arranged on a side of the first metal layer; and
  a second metal layer arranged on a side of the insulation layer away from the first metal layer, the second metal layer includes a third metal pattern and a fourth metal pattern separated from each other, the third metal pattern being located in the blank area, and the fourth metal pattern being located in the encapsulation area; the first metal pattern and the third metal pattern are connected via a first through hole provided in the insulation layer; the second metal pattern and the fourth metal pattern are connected via a second through hole provided in the insulation layer.

The present disclosure provides a display module including a display panel and any one the printed circuit boards described. The printed circuit board is connected to the display panel, and is configured to provide a driving signal to the display panel, the driving signal being used for driving the display panel to display a picture.

In an optional implementation, the display module further includes a backlight plate arranged on a backlight surface of the display panel; the printed circuit board is located on a side of the backlight plate away from the display panel, and conductive foam is provided between the blank area of the printed circuit board and the backlight plate, and is configured to electrically connect the first metal pattern to the backlight plate.

The present disclosure provides a display device including any of the display modules described above.

In an optional implementation, the display device further includes:

a housing arranged on a side of the backlight plate away from the display panel; and a conductive screw for fixing the backlight plate and the housing.

The present disclosure provides a driving method of a display module, applied to any of the display modules described above, including:

controlling the display panel to pause refreshing display and hold current display when a quantity of electrostatic charges on the display panel is greater than or equal to a preset threshold; and controlling the display panel to refresh display when a duration of holding the current display is greater than or equal to a preset duration.

In an optional implementation, the preset duration is greater than or equal to a duration of 1 frame and less than or equal to a duration of 20 frames.

In an optional implementation, the display panel includes a plurality of thin film transistors, and the controlling the display panel to pause refreshing display and holding current display includes:

providing a first turn-off voltage to a gate electrode of the thin film transistor, the first turn-off voltage being a gate electrode voltage for controlling the thin film transistor to be turned off when refreshing display; or, providing a second turn-off voltage to the gate electrode of the thin film transistor, a leakage current of the thin film transistor under the second turn-off voltage being less than a leakage current of the thin film transistor under the first turn-off voltage.

The above description is merely a summary of the technical solutions of the present disclosure. In order to more clearly know the technical means of the present disclosure so that the technical means can be implemented according to the contents of the description, and in order to make the above and other objectives, features and advantages of the present disclosure more apparent and understandable, particular embodiments of the present disclosure are provided below.

BRIEF DESCRIPTION OF THE DRAWINGS

In order to more clearly illustrate the technical solutions of the embodiments of the present disclosure or the related art, the figures that are required to describe the embodiments or the related art will be briefly introduced below. Apparently, the figures that are described below are embodiments of the present disclosure, and those skilled in the art may obtain other figures according to these figures without paying creative work. It should be noted that the scales in the drawings are merely illustrative and do not indicate the actual scales.

DETAILED DESCRIPTION OF THE EMBODIMENTS

In order to make the objects, the technical solutions and the advantages of the embodiments of the present disclosure clearer, the technical solutions of the embodiments of the present disclosure will be clearly and thoroughly described below with reference to the drawings of the embodiments of the present disclosure. Apparently, the described embodiments are merely certain embodiments of the present disclosure, rather than all of the embodiments. All of the other embodiments that those skilled in the art obtained on the basis of the embodiments of the present disclosure without paying creative work fall within the protection scope of the present disclosure.

In the related art, when a display module is loaded into a complete machine of a client for an electro-static discharge (ESD) test, abnormalities such as flashing lines, jittering or screen flickering may occur on the screen, and these abnormalities are caused by the poor discharge capability of the complete machine.

Figure 1:
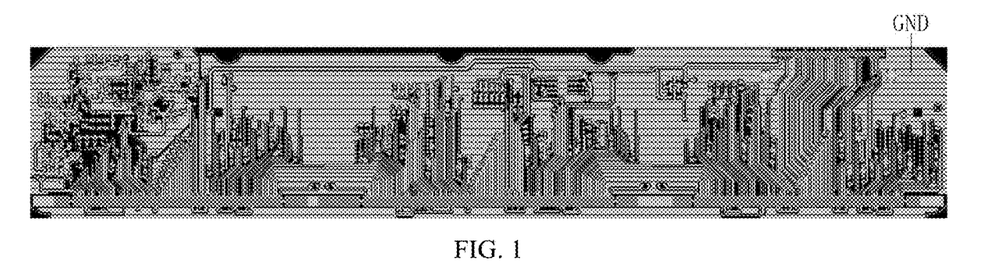
FIG. 1 is a schematic planar structural diagram of a printed circuit board in the related art.

Referring to FIG. 1. FIG. 1 is a schematic planar structural diagram of a printed circuit board in the related art. As shown in FIG. 1, the ground GND in the circuit of the printed circuit board has a connected whole plane structure.

Figure 2:
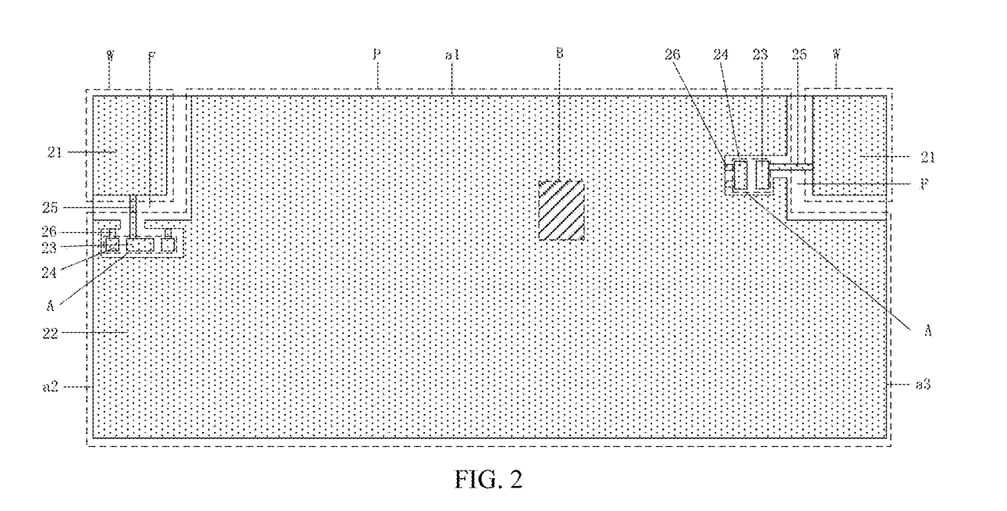
FIG. 2 is a schematic planar structural diagram of a first printed circuit board provided in the present disclosure.
Figure 3:
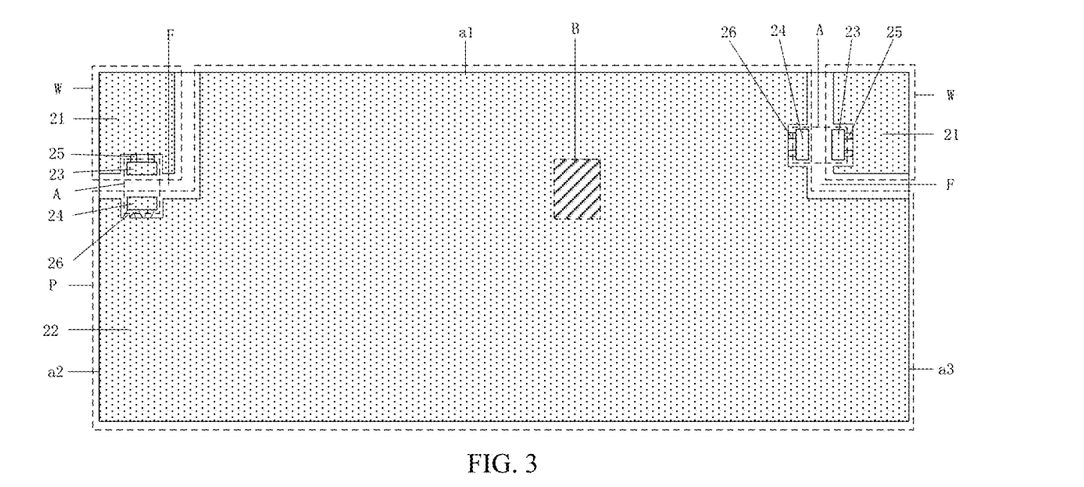
FIG. 3 is a schematic planar structural diagram of a second printed circuit board provided in the present disclosure.
Figure 4:
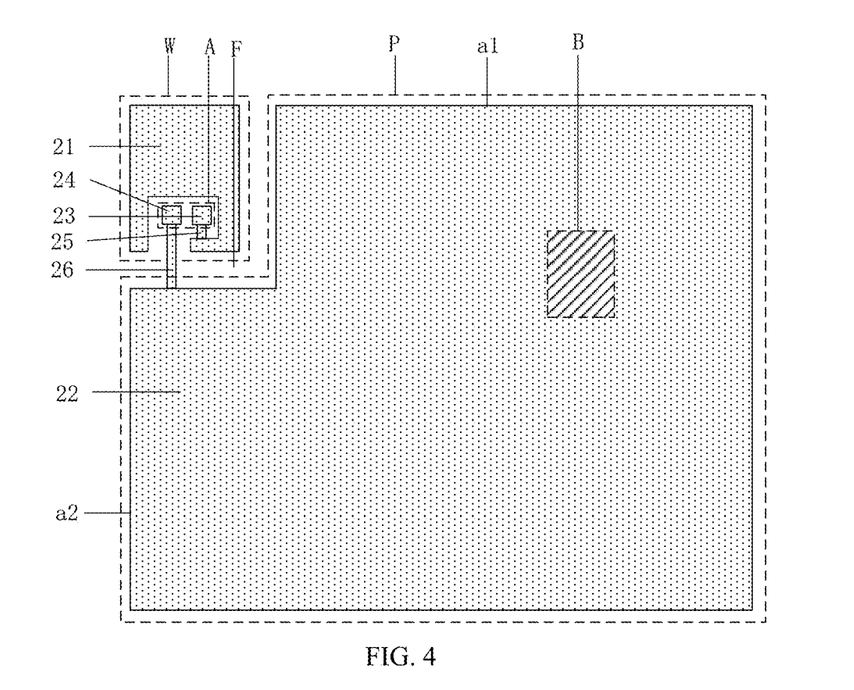
FIG. 4 is a schematic planar structural diagram of a third printed circuit board provided in the present disclosure.

In order to improve the discharge capacity of the complete machine, the present disclosure provides a printed circuit board for encapsulating an electrostatic isolation device A and a functional electronic device B. Referring to FIGS. 2 to 4. FIGS. 2 to 4 are schematic planar structural diagrams of several printed circuit boards provided in the present disclosure. The printed circuit board includes a blank area W and an encapsulation area P.

The printed circuit board includes a first metal layer. As shown in FIGS. 2 to 4, the first metal layer includes a first metal pattern 21 and a second metal pattern 22 separated from each other, a first pad 23 connected to the first metal pattern 21, and a second pad 24 connected to the second metal pattern 22.

The first metal pattern 21 is located in the blank area W, and the second metal pattern 22 is located in the encapsulation area P. The first pad 23 and the second pad 24 are configured to be connected to an electrostatic isolation device A, and the second metal pattern 22 is configured to be connected to a functional electronic device B.

The electrostatic isolation device A is a device connected between the first metal pattern 21 and the second metal pattern 22 and having a function of blocking electrostatic interference. The functional electronic device B is an electronic device, among electronic devices that may be packaged on the printed circuit board, other than the electrostatic isolation device A.

As shown in FIGS. 2 to 4, all the functional electronic devices B are located in the encapsulation area P, i.e., the functional electronic devices B are all connected to the second metal pattern 22. That is, no functional electronic device B is provided in the blank area W, i.e., the functional electronic device B is not connected to the first metal pattern 21.

As the first pad 23 is connected to the first metal pattern 21 and the second pad 24 is connected to the second metal pattern 22, the connection between the first metal pattern 21 and the second metal pattern 22 may be achieved after the electrostatic isolation device A is mounted on the first pad 23 and the second pad 24.

By providing the electrostatic isolation device A on the connection path between the first metal pattern 21 and the second metal pattern 22, the quantity of the electrostatic charges transferred from the first metal pattern 21 to the second metal pattern 22 may be reduced, thereby reducing interference of static electricity to the second metal pattern 22 and the functional electronic device B connected to the second metal pattern 22.

When the printed circuit board provided in the present disclosure is applied to a display module, the first metal pattern 21 of the printed circuit board may be arranged to be electrically connected to a metal shell of the display module, so that the first metal pattern 21 is on a path through which the metal shell is connected to the second metal pattern 22. In this way, the electrostatic charges generated on the metal shell are first transferred to the first metal pattern 21, reduced through the electrostatic isolation device A and then transferred to the second metal pattern 22, so that the quantity of the electrostatic charges transferred to the second metal pattern 22 may be reduced. As all the functional electronic devices B are connected to the second metal pattern 22, the influence of the electrostatic charges on the functional electronic devices B may be reduced, thereby reducing the influence of the electrostatic charges on the display panel, preventing display abnormalities such as flashing lines, jittering or screen flickering caused by static electricity during the ESD test or during use, and improving the picture display effect and stability.

The printed circuit board provided in the present disclosure may include the electrostatic isolation device A, or include the functional electronic device B, or include the electrostatic isolation device A and the functional electronic device B, or exclude the electrostatic isolation device A and the functional electronic device B, which is not limited in the present disclosure.

In the present disclosure, the first metal layer may include one first metal pattern 21 (as shown in FIG. 4), or a plurality of first metal patterns 21 (two as shown in FIG. 2 and FIG. 3), which is not limited in the present disclosure.

In an alternative implementation, the first metal layer includes a plurality of first metal patterns 21, and the plurality of first metal patterns 21 are all located in the blank area W.

The plurality of first metal patterns 21 and the second metal pattern 22 are separated from each other, i.e., the plurality of first metal patterns 21 are separated from each other, and each of the first metal patterns 21 and the second metal pattern 22 are separated from each other.

Accordingly, the first metal layer may include a plurality of first pads 23 and a plurality of second pads 24. The plurality of first metal patterns 21 are correspondingly connected to different first pads 23, respectively; the second pads 24 are arranged in correspondence with the first pads 23, and a second pad 24 and a first pad 23, which are arranged in correspondence, are configured to be connected to the same electrostatic isolation device A.

The first metal patterns 21 may be connected to the first pads 23 in a one-to-one correspondence, and different first metal patterns 21 are connected to different first pads 23.

Each of the second pads 24 is connected to the second metal pattern 22. The second pads 24 may be arranged in a one-to-one correspondence with the first pads 23, different second pads 24 correspond to different first pads 23, and a second pad 24 and a first pad 23, which are arranged in correspondence, may be connected to a first end and a second end of the same electrostatic isolation device A, respectively.

In the present implementation, the plurality of first metal patterns 21 may be electrically connected to the metal shell of the display module, so that each of the first metal patterns 21 and a correspondingly connected electrostatic isolation device A are on a path through which the metal shell and the second metal pattern 22 are connected. In this way, the electrostatic discharge path from the metal shell to the second metal pattern 22 may be increased, and the quantity of the electrostatic charges transferred to the second metal pattern 22 is further reduced to reduce the influence of the electrostatic charges on the functional electronic device B, thereby reducing the influence of the electrostatic charges on the display panel, preventing abnormalities such as flashing lines, jittering or screen flickering on the display panel caused by static electricity during the ESD test or during use, and improving the picture display effect and stability.

Exemplarily, as shown in FIG. 2 and FIG. 3, the first metal layer includes two first metal patterns 21, two first pads 23 and two second pads 24. The first metal patterns 21, the first pads 23 and the second pads 24 are in a one-to-one correspondence.

Optionally, the two first metal patterns 21 are arranged on opposite sides of the second metal pattern 22, respectively.

Optionally, as shown in FIG. 2 and FIG. 3, the two first metal patterns 21 are arranged close to a first side edge a1 of the printed circuit board.

The first side edge a1 may be, for example, a side edge of the printed circuit board where a client signal input interface is provided, which is not limited in the present disclosure.

Optionally, as shown in FIG. 2 and FIG. 3, the two first metal patterns 21 are also arranged close to a second side edge a2 and a third side edge a3, respectively, of the printed circuit board.

The second side edge a2 and the third side edge a3 may be oppositely arranged, and both perpendicular to the first side edge a1.

In FIG. 2 and FIG. 3, the first metal layer includes two first metal patterns 21, one of them is arranged close to the first side edge a1 and the second side edge a2, i.e., at an upper left corner of the printed circuit board; the other is arranged close to the first side edge a1 and the third side edge a3, i.e., at an upper right corner of the printed circuit board.

That is, the two first metal patterns 21 are located at the upper left corner and the upper right corner of the printed circuit board, respectively. Accordingly, the two first pads 23 are arranged close to the upper left corner and upper right corner of the printed circuit board, respectively, and two second pads 24 are arranged close to the upper left corner and upper right corner of the printed circuit board, respectively.

The first metal pattern 21 at the upper left corner is connected to the first pad 23 at the upper left corner, the first pad 23 at the upper left corner is arranged to be in correspondence to the second pad 24 at the upper left corner, and the first pad 23 at the upper left corner and the second pad 24 at the upper left corner may be connected to the same electrostatic isolation device A, so that the quantity of the electrostatic charges transferred from the first metal pattern 21 at the upper left corner to the second metal pattern 22 may be reduced.

The first metal pattern 21 at the upper right corner is connected to the first pad 23 at the upper right corner, the first pad 23 at the upper right corner is arranged to be in correspondence to the second pad 24 at the upper right corner, and the first pad 23 at the upper right corner and the second pad 24 at the upper right corner may be connected to the same electrostatic isolation device A, so that the quantity of the electrostatic charges transferred from the first metal pattern 21 at the upper right corner to the second metal pattern 22 may be reduced.

Illustratively, in FIG. 4, the first metal layer includes one first metal pattern 21, and the first metal pattern 21 is arranged close to the first side edge a1 and the second side edge a2, i.e., at the upper left corner of the printed circuit board shown in FIG. 4.

By arranging the first metal pattern 21 at the inner corner of the printed circuit board, the arrangement concentration of the functional electronic device B may be improved.

Figure 10:
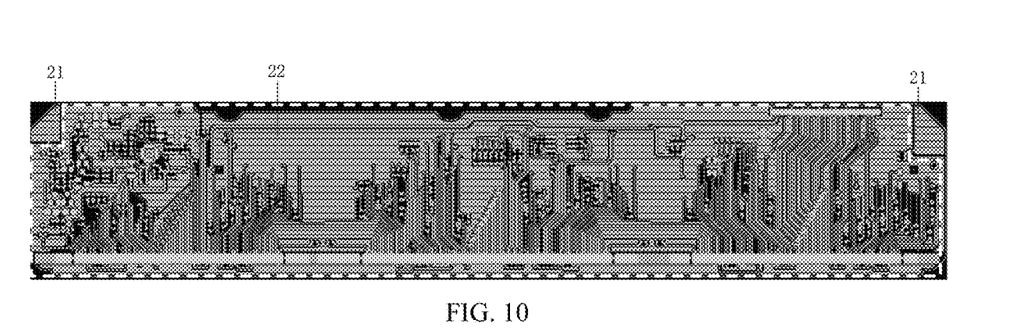
FIG. 10 is a schematic planar structural diagram of a first printed circuit board provided in the present disclosure.

Optionally, the shape of the first metal pattern 21 may be a polygon such as a triangle, a rectangle (as shown in FIG. 2), a parallelogram, a trapezoid (as shown in FIG. 10), a rhomb, a pentagon, a hexagon, etc., and also may be a circle, an ellipse, a sector, etc., and the shape of the first metal pattern 21 may be a regular pattern or an irregular pattern, which is not limited in the present disclosure.

In particular implementations, the arrangement of the first pad(s) 23 and the second pad(s) 24 may be implemented in various ways.

In a first implementation, as shown in FIG. 2, both the first pad(s) 23 and the second pad(s) 24 are located in the encapsulation area P.

In the present implementation, as the first pad(s) 23 and the second pad(s) 24 are both located in the encapsulation area P, the electrostatic isolation device A is also located in the encapsulation area P after being mounted, so that the electrostatic isolation device A is located farther away from the first metal pattern 21, thereby preventing the electrostatic isolation device A from being broken down by electrostatic charges on the first metal pattern 21.

Optionally, as shown in FIG. 2, the blank area W is separated from the encapsulation area P by a boundary area F. The first pad 23 is arranged in the encapsulation area P and close to the boundary area F to shorten a charge transfer path between the first metal pattern 21 and the first pad 23.

By shortening the charge transfer path between the first metal pattern 21 and the first pad 23, the transfer distance of the electrostatic charges from the first metal pattern 21 to the electrostatic isolation device A may be shortened, facilitating the quick release of the electrostatic charges.

In a second implementation, as shown in FIG. 3, the first pad 23 is located in the blank area W, and the second pad 24 is located in the encapsulation area P.

In the present implementation, since the first pad 23 and the first metal pattern 21 are both located in the blank area W, the first metal pattern 21 and the first pad 23 may be arranged in the shortest path, so that the transfer path of the electrostatic charges from the first metal pattern 21 to the electrostatic isolation device A may be minimized, facilitating the quick release of the electrostatic charges.

Optionally, as shown in FIG. 3, the blank area W is separated from the encapsulation area P by the boundary area F. The first pad 23 is arranged within the blank area W and close to the boundary area F, and the second pad 24 is arranged within the encapsulation area P and close to the boundary area.

As the first pad 23 is located in the blank area W and is arranged close to the boundary area F, and the second pad 24 is located in the encapsulation area P and is arranged close to the boundary area F, the electrostatic isolation device A is provided across the boundary area F after being mounted, rather than being located in the encapsulation area P or the blank area W. Therefore, on the one hand, the electrostatic isolation device A may be prevented from being broken down by static electricity, and on the other hand, the distance between the electrostatic isolation device A and the functional electronic device B may be increased to prevent the electrostatic isolation device A from generating electromagnetic interference to the functional electronic device B.

In a third implementation, as shown in FIG. 4, both the first pad 23 and the second pad 24 are located in the blank area W.

As the first pad 23 and the first metal pattern 21 are both located in the blank area W, the transfer path of the electrostatic charges from the first metal pattern 21 to the electrostatic isolation device A may be minimized, facilitating the quick release of the electrostatic charges. In addition, as the first pad 23 and the second pad 24 are both located in the blank area W, the electrostatic isolation device A is also located in the blank area W after being mounted, so that the distance between the electrostatic isolation device A and the functional electronic device B may be further increased to prevent the electrostatic isolation device A from generating electromagnetic interference to the functional electronic device B.

Optionally, as shown in FIG. 4, the blank area W is separated from the encapsulation area P by the boundary area F, and the first pad 23 and the second pad 24 may both be arranged in the blank area W and close to the boundary area F, which is not limited in the present disclosure.

Optionally, as shown in FIG. 2 to FIG. 4, the first metal layer further includes a first metal wire 25. The first metal wire 25 is connected between the first metal pattern 21 and the first pad 23.

The first metal pattern 21, the first pad 23 and the first metal wire 25 may be arranged in the same layer and form an integrated structure.

Optionally, the first metal layer further includes a second metal wire 26. The second metal wire 26 is connected between the second metal pattern 22 and the second pad 24.

The second metal pattern 22, the second pad 24, and the second metal wire 26 may be arranged in the same layer and form an integrated structure.

In particular implementations, the electrostatic isolation device A may include one electronic element or a plurality of electronic elements, which is not limited in the present disclosure.

When the electrostatic isolation device A includes one electronic element, a first end of the electronic element may be connected to the first pad 23 and a second end of the electronic element may be connected to the second pad 24.

When the electrostatic isolation device A includes a plurality of electronic elements, the connection between the plurality of electronic elements and the first pad 23 may be implemented in various ways.

Figure 5:
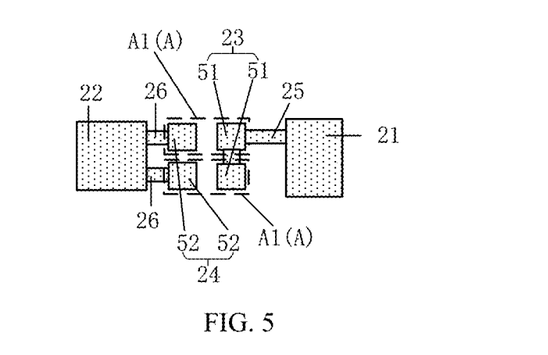
FIG. 5 is a schematic diagram of a first connecting structure provided in the present disclosure.
Figure 6:
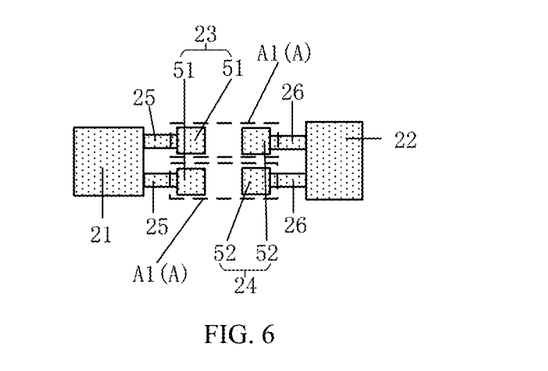
FIG. 6 is a schematic diagram of a second connecting structure provided in the present disclosure.
Figure 7:
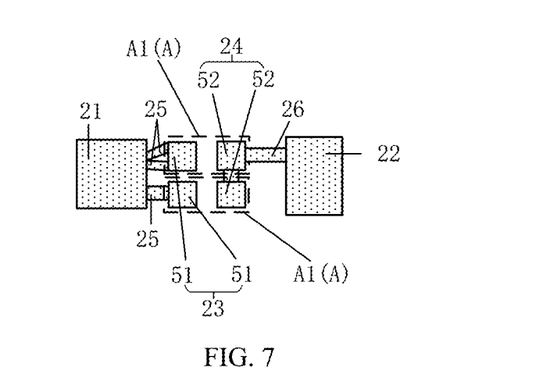
FIG. 7 is a schematic diagram of a third connecting structure provided in the present disclosure.

For example, as shown in FIG. 5 to FIG. 7, the first pad 23 may include a plurality of first sub-pads 51, and the plurality of first sub-pads 51 are configured to be connected to first ends of different electronic elements A1, respectively. The number of the first sub-pads 51 may be the same as the number of the electronic elements A1 included in the electrostatic isolation device A, and the first sub-pads 51 are connected to the electronic elements A1 in a one-to-one correspondence.

Optionally, as shown in FIG. 5, the plurality of first sub-pads 51 may be connected to each other, and the plurality of first sub-pads 51 are connected to the first metal pattern 21 through the same first metal wire 25. In this way, the plurality of first sub-pads 51 share the same first metal wire 25 for connection with the first metal pattern 21, reducing a space on the printed circuit board occupied by the first metal wire 25.

Alternatively, as shown in FIG. 6 and FIG. 7, the plurality of first sub-pads 51 are separated from each other, and the plurality of first sub-pads 51 are connected to the first metal pattern 21 through different first metal wires 25, respectively.

As shown in FIG. 6, one first metal wire 25 may be arranged between the first metal pattern 21 and each first sub-pad 51, i.e., the number of the first metal wires 25 may be the same as the number of the first sub-pads 51. As shown in FIG. 7, one or more first metal wires 25 may be arranged between the first metal pattern 21 and each first sub-pads 51, i.e., the number of the first metal wires 25 may be greater than the number of the first sub-pads 51.

In this way, the plurality of first sub-pads 51 are connected to the first metal pattern 21 through the plurality of first metal wires 25, which is equivalent to widening a transfer channel of the electrostatic charges from the first metal pattern 21 to the electrostatic isolation device A, facilitating the quick release of the electrostatic charges.

When the electrostatic isolation device A includes a plurality of electronic elements, the connection between the plurality of electronic elements and the second pad 24 may be implemented in various ways.

For example, as shown in FIG. 6 and FIG. 7, the second pad 24 may include a plurality of second sub-pads 52, and the plurality of second sub-pads 52 are configured to be connected to second ends of different electronic elements A1, respectively. The number of the second sub-pads 52 may be the same as the number of the electronic elements A1 included in the electrostatic isolation device A. The second sub-pads 52 are connected to the electronic elements A1 in a one-to-one correspondence.

Optionally, as shown in FIG. 7, the plurality of second sub-pads 52 may be connected to each other, and the plurality of second sub-pads 52 are connected to the second metal pattern 22 through the same second metal wire 26. In this way, the plurality of second sub-pads 52 share the same second metal wire 26 for connection with the second metal pattern 22, reducing a space on the printed circuit board occupied by the second metal wire 26.

Alternatively, as shown in FIG. 6, the plurality of second sub-pads 52 are separated from each other, and the plurality of second sub-pads 52 are connected to the second metal pattern 22 through different second metal wires 26, respectively.

The number of the second metal wires 26 may be greater than or equal to the number of the second sub-pads 52, which is not limited in the present disclosure.

In the present disclosure, the electrostatic isolation device A may include one of the following electronic elements or more than one of the following electronic elements connected in parallel; a capacitor, a resistor, a magnetic bead, or other elements having the function of electrostatic isolation.

Figure 8:
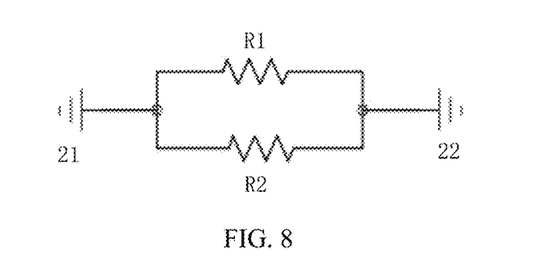
FIG. 8 is a schematic structural diagram of an electrostatic isolation device provided in the present disclosure.

Illustratively, as shown in FIG. 8, the electrostatic isolation device A may include two magnetic beads connected in parallel, for example, a magnetic bead R1 and a magnetic bead R2 shown in FIG. 8.

In particular implementations, the electrostatic isolation device A may also include only one magnetic bead, or three, four, or more magnetic beads connected in parallel with each other, and the number of magnetic beads included in the electrostatic isolation device A is not limited in the present disclosure.

In particular implementations, the model of the magnetic beads may be determined according to factors such as the actual structure of the display panel, the electrostatic protection effect and costs, which is not limited in the present disclosure. For example, the model of the magnetic beads may be 600 Ω/1.3 A/100 MHZ, i.e., when the frequency is 100 MHZ, the impedance of the magnetic bead is 600Ω and the rated current is 1.3 A.

Optionally, a size of the first metal pattern 21 is greater than or equal to 5 millimeters and less than or equal to 15 millimeters in a plane where the first metal layer is located.

When the size of the first metal pattern 21 is smaller than the above range, the size of the first metal pattern 21 is too small, which is inconvenient for a worker to stick conductive foam to achieve electrical connection between the first metal pattern 21 and the metal shell.

When the size of the first metal pattern 21 is greater than the above range, the size of the first metal pattern 21 is too large, which may increase the consumption of the conductive foam, resulting in an increase in costs and occupying an excessive space of the printed circuit board.

Therefore, when the size of the first metal pattern 21 is within the above range, on the one hand, it is convenient for the worker to stick the conductive foam; on the other hand, it may reduce the consumption of conductive foam, reducing the costs and preventing unnecessary space occupation on the printed circuit board.

Illustratively, the size of the first metal pattern 21 may be 5 mm×5 mm, or 8 mm×8 mm, or 10 mm×10 mm, or 5 mm×8 mm, or 8 mm×10 mm, etc., in the plane where the first metal layer is located, which is not limited in the present disclosure.

Figure 9:
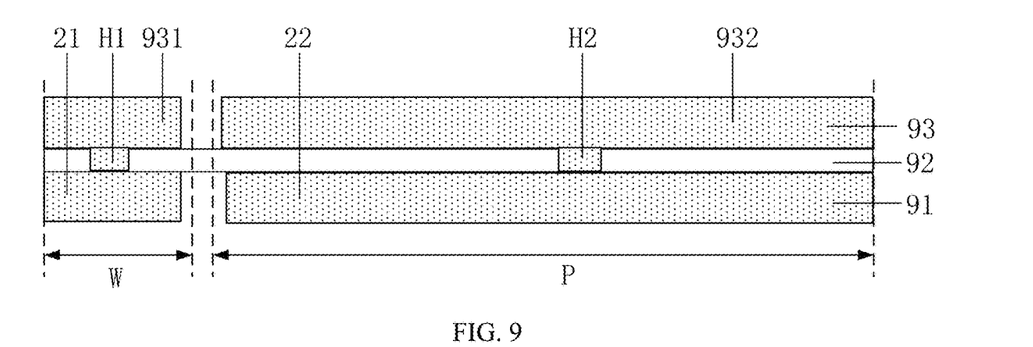
FIG. 9 is a schematic cross-sectional structural diagram of a printed circuit board provided in the present disclosure.

In particular implementations, as shown in FIG. 9, the printed circuit board may further include: an insulation layer 92 arranged on a side of the first metal layer 91; and a second metal layer 93 arranged on a side of the insulation layer 92 away from the first metal layer 91. The second metal layer 93 includes a third metal pattern 931 and a fourth metal pattern 932 separated from each other, the third metal pattern 931 being located in the blank area W, and the fourth metal pattern 932 being located in the encapsulation area P.

Optionally, the first metal pattern 21 and the third metal pattern 931 are connected via a first through hole H1 provided in the insulation layer 92; the second metal pattern 22 and the fourth metal pattern 932 are connected via a second through hole H2 provided in the insulation layer 92.

The first metal layer 91 and the second metal layer 93 may both be grounded layers in the printed circuit board. The materials of the first metal layer 91 and the second metal layer 93 may include one or more of metallic materials such as copper, gold, silver, etc.

Figure 11:
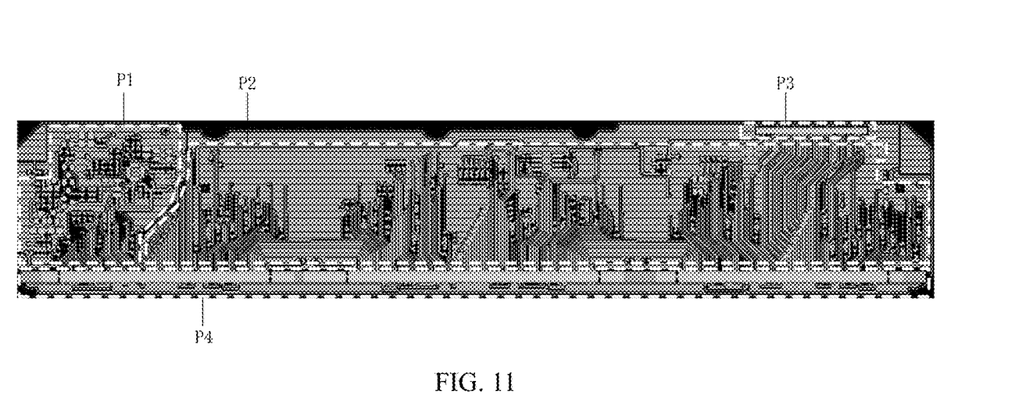
FIG. 11 is a schematic planar structural diagram of a first printed circuit board provided in the present disclosure.

Referring to FIG. 10 and FIG. 11, FIG. 10 and FIG. 11 are schematic planar structural diagrams of the printed circuit board shown in FIG. 2.

Illustratively, referring to FIG. 11, the encapsulation area P may be divided into a first area P1, a second area P2, a third area P3, and a fourth area P4.

The first area P1 is used for encapsulating a power supply circuit, and the power supply circuit is configured to generate a voltage required by the display panel for display, for example, a liquid crystal drive voltage, a turn-on voltage of a thin film transistor, a turn-off voltage of a thin film transistor, a common voltage, etc. The second area P2 is used for encapsulating components such as capacitors and resistors for voltage stabilization or filtering on the periphery of a driving chip of the display panel. The third area P3 is used for encapsulating a connector which may serve as a client signal input interface. The fourth area is used for connecting the driving chip of the display panel.

Figure 12:
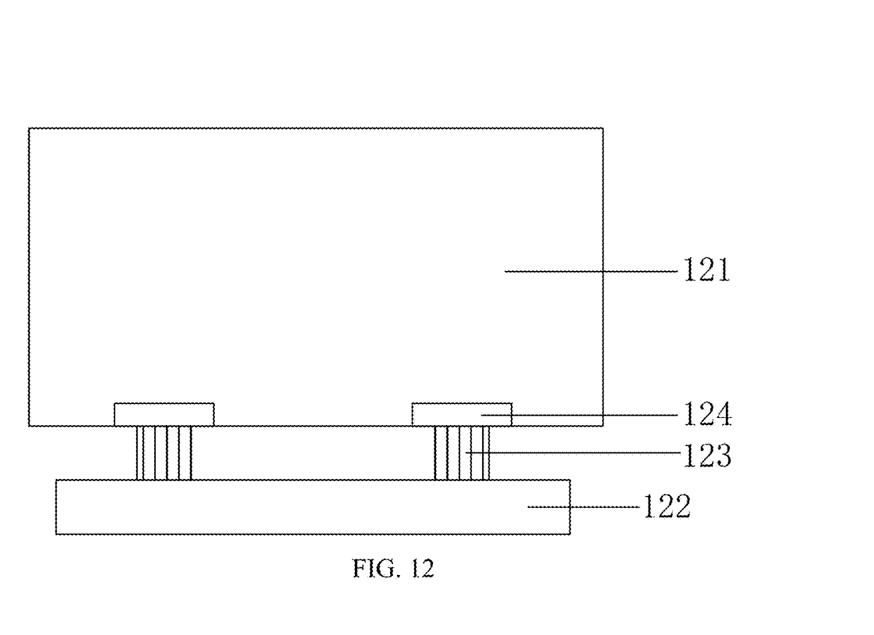
FIG. 12 is a schematic diagram of a connecting structure of a display module provided in the present disclosure.

The present disclosure provides a display module. As shown in FIG. 12, the display module includes a display panel 121, and a printed circuit board 122 provided in any of the above.

The printed circuit board 122 is connected to the display panel 121, and is configured to provide a driving signal to the display panel 121, the driving signal being used for driving the display panel 121 to display a picture.

As the display module includes the printed circuit board 122 described above, it will be understood by those skilled in the art that the display module has the advantages of the printed circuit board 122 provided in the present disclosure, which will not be described in detail herein.

Illustratively, as shown in FIG. 12, the display module may further include a flexible circuit board 123 and a driving chip 124. The printed circuit board 122 is connected to the flexible circuit board 123, the flexible circuit board 123 is connected to the driving chip 124, and the driving chip 124 is connected to the display panel 121.

Figure 13:
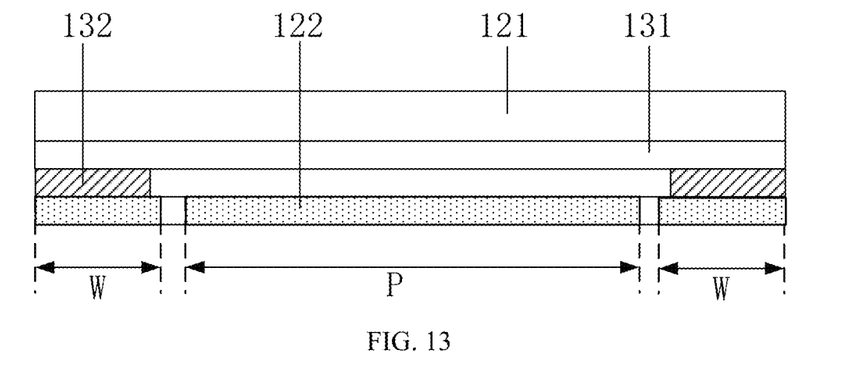
FIG. 13 is a schematic cross-sectional structural diagram of a display module provided in the present disclosure.

In particular implementations, as shown in FIG. 13, the display module may further include a backlight plate 131 arranged on a backlight surface of the display panel 121. The printed circuit board 122 may be located on a side of the backlight plate 131 away from the display panel 121. Conductive foam 132 may be provided between the blank area W of the printed circuit board 122 and the backlight plate 131, and is configured to electrically connect the first metal pattern 21 in the blank area W to the backlight plate 131.

As the blank area W of the printed circuit board 122 is connected, through the conductive foam 132, to the metal shell at a side of the backlight plate 131 away from the display panel 121, electrostatic charges generated on the metal shell are transferred to the first metal pattern 21 through the conductive foam 132, reduced through the electrostatic isolation device A and then transferred to the second metal pattern 22, so that the quantity of the electrostatic charges transferred to the second metal pattern 22 may be reduced.

As all the functional electronic devices B are connected to the second metal pattern 22, the influence of the electrostatic charges on the functional electronic devices B may be reduced, thereby reducing the influence of the electrostatic charges on the display panel, preventing abnormalities such as flashing lines, jittering or screen flickering on the display panel caused by static electricity during the ESD test or during use, and improving the the picture display effect and stability.

The present disclosure provides a display device, including any of the provided display modules.

As the display device includes the display module described above, it will be understood by those skilled in the art that the display device has the advantages of the display module provided in the present disclosure, which will not be described in detail herein.

It should be noted that the display device in the present embodiment may be any product or component with a 2D or 3D display function, such as an electronic paper, a mobile phone, a tablet computer, a television, a notebook computer, a digital photo frame, a virtual reality device, augmented reality equipment, a full display with camera, a navigator, and a vehicle-mounted display device.

Optionally, the display device further includes a housing (not shown in the figure). Referring to FIG. 13, the housing may be arranged at a side of the backlight plate 131 away from the display panel 121.

Referring to FIG. 13, when the printed circuit board 122 is located on the side of the backlight plate 131 away from the display panel 121, the housing is arranged on a side of the backlight plate 131 and the printed circuit board 122 away from the display panel 121, and the housing is electrically connected to the backlight plate 131.

Optionally, the display device further includes a conductive screw fixing the backlight plate 131 and the housing. The housing may be electrically connected to the metal shell in the backlight plate 131 through the conductive screw.

When a complete machine ESD test is performed on the display device, a discharge gun is used to discharge the housing, and electrostatic charges generated on the housing are transferred to the metal shell in the backlight plate 131 through the conductive screw, then transferred from the metal shell to the first metal pattern 21 in the blank area W through the conductive foam 132, reduced by the electrostatic isolation device A and then transferred to the second metal pattern 22, so that the quantity of the electrostatic charges transferred to the second metal pattern 22 may be reduced. As all the functional electronic devices B are connected to the second metal pattern 22, the influence of the electrostatic charges on the functional electronic devices B may be reduced, and the influence of the electrostatic charges on the output signal of the printed circuit board 122 may be reduced, thereby reducing the influence of the electrostatic charges on the display panel connected to the printed circuit board 122, preventing abnormalities such as flashing lines, jittering or screen flickering on the display panel caused by static electricity during the ESD test or during use, and improving the the picture display effect and stability.

It should be noted that the housing may also be electrically connected to the backlight plate 131 in other ways, for example, a conductive tape may be provided between the housing and the backlight plate 131 for fixing and electrical connection between the housing and the backlight plate 131.

Figure 14:
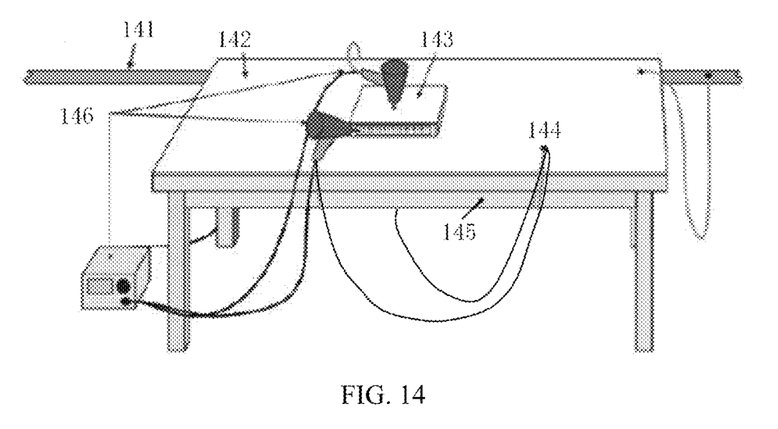
FIG. 14 is a schematic structural diagram of an ESD test system provided in the present disclosure.

Referring to FIG. 14, an ESD test system is shown. The test system includes a grounding bus 141, a grounding metal iron block 142, a to-be-tested unit 143 (e.g., a display module or a display device, etc.), a discharge path 144 of the to-be-tested unit, a wooden table 145, and test equipment 146.

The process for conducting an ESD test on the to-be-tested unit 143 using the ESD test system is as follows.

At step 1, the to-be-tested unit 143 is placed on and fixed to the grounding metal iron block 142 and the wooden table 145.

At step 2, the discharge path 144 of the to-be-tested unit is connected.

At step 3, the to-be-tested unit 143 is turned on.

At step 4, a corresponding test equipment 146 is selected, and the test equipment 146 is started. The test equipment 146 may be, for example, a discharge gun of 150 pF/330 Ω or a discharge gun of 330 pF/330Ω, and a ±6 KV contact discharge gun/an ±8 KV air discharge gun.

At step 5, an ESD test is conducted on the to-be-tested unit 143, i.e., the discharge gun is used to discharge a specific part of the to-be-tested unit 143, and the display condition of the screen is observed. The specific part of the to-be-tested unit 143 may be, for example, the housing of the complete machine, a rear iron shell, or a conductive screw on the rear iron shell of the display device.

The present disclosure provides a driving method of a display module, which is applied to any of the provided display modules. The driving method includes the following steps.

At step 01, the display panel is controlled to pause refreshing display and hold current display when the quantity of the electrostatic charges on the display panel is greater than or equal to a preset threshold.

In particular implementations, the driving chip in the display panel may detect the electrostatic charges, and control the display panel to hold the current display.

At step 02, the display panel is controlled to refresh display when a duration of holding the current display is greater than or equal to a preset duration.

In particular implementations, the display panel may be controlled by the driving chip in the display panel to refresh display.

Figure 15:
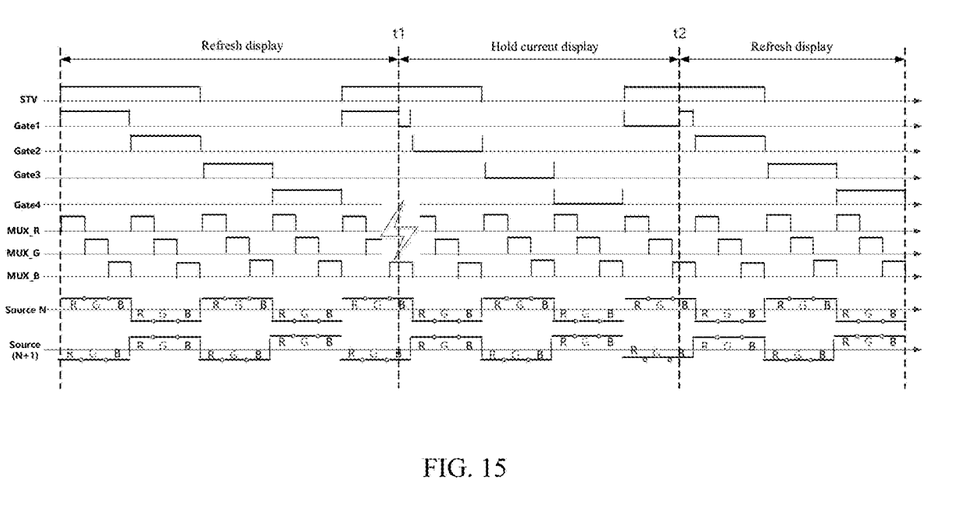
FIG. 15 is a schematic diagram illustrating a driving timing sequence provided in the present disclosure.

When the display panel is a liquid crystal display panel, due to the driving principle of liquid crystal, the driving of the display panel adopts a time division multiplexing timing sequence, as shown in FIG. 15. STV is a timing sequence trigger signal, and when STV is at a high level, the driving timing sequence starts to work. Gate n signal is a turn-on signal of the nth gate line, and when the Gate n is at a high level, the nth gate line is turned on. MUX_R/MUX_G/MUX_B is a selection turn-on signal of a red sub-pixel R/green sub-pixel G/blue sub-pixel B. The data line may supply the red sub-pixel R with a data signal 'source' only when MUX_R is at a high level. The data line charge may supply the green sub-pixel G with the data signal 'source' only when MUX_G is at a high level. The data line may supply the blue sub-pixel B with the data signal 'source' only when MUX_B is at a high level.

In summary, the timing sequence trigger signal STV triggers the driving timing sequence first, then the nth gate line is turned on, and the red sub-pixel R/green sub-pixel G/blue sub-pixel B is charged based on the cooperation of the data line and the selection turn-on signal MUX_R/MUX_G/MUX_B.

When it is detected that the quantity of the electrostatic charges is greater than or equal to a preset threshold value, i.e., when static electricity is detected (time t1 in FIG. 15), then the display panel may be controlled not to charge or discharge, i.e., pause refreshing display, and hold current display, thereby preventing the interference of static electricity on the display signal, and preventing abnormalities such as flashing lines, jittering or screen flickering on the display picture.

When the duration of holding the current picture is greater than or equal to a preset duration, corresponding to time t2 in FIG. 15, then the display panel may be controlled to resume refreshing display for normal display.

The specific values of the preset threshold and the preset duration may be determined according to actual requirements, which is not limited in the present disclosure.

Optionally, the preset duration may be a positive integer multiple of a duration of one frame, and the positive integer may be greater than or equal to 1 and less than or equal to 20.

Optionally, the preset duration is greater than or equal to the duration of one frame and less than or equal to the duration of 20 frames.

Figure 16:
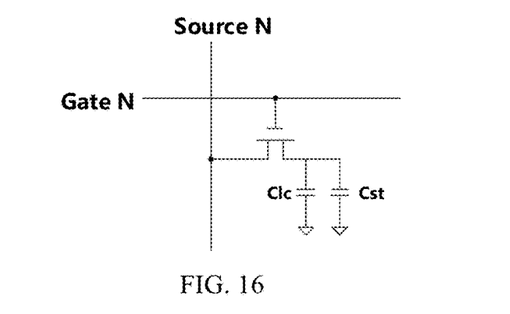
FIG. 16 is a schematic equivalent structural diagram of a sub-pixel provided in the present disclosure.

The display panel may include a plurality of thin film transistors. Referring to FIG. 16, a gate line Gate N controls the turn-on of thin film transistors in a row, a data line Source N charges pixel electrodes in a column. The pixel electrode is an electrode plate of a pixel capacitor Clc. A storage capacitor Cst connected in parallel with the pixel capacitor is configured to keep a display voltage unchanged before the next charging, so as to reduce the influence of leakage current on the display.

Optionally, in step 02, the step that the display panel is controlled to pause refreshing display and hold current display may include: a first turn-off voltage is provided to a gate electrode of the thin film transistor, the first turn-off voltage being a gate electrode voltage for controlling the thin film transistor to be turned off when refreshing display. That is, the first turn-off voltage is the turn-off voltage of the thin film transistor during normal display of the display panel.

That is, when static electricity is detected, by providing the first turn-off voltage to the gate electrode of the thin film transistor, all the thin film transistors in the display panel may be controlled to be turned off to disconnect the connection between the pixel electrodes and the data lines and stop charging or discharging of the pixel electrodes, thereby holding the current display.

Due to the leakage current of the thin film transistor, in the duration of holding the current display, especially when the preset time is longer than a duration of one frame, even if the thin film transistor is turned off under the the first turn-off voltage, the existence of the leakage current may still result in charge loss of the pixel electrodes, thus resulting in a situation that the display brightness decreases gradually.

In order to solve the above problem, alternatively, in step 02, the step that the display panel is controlled to pause refreshing display and hold current display may include: a second turn-off voltage is provided to the gate electrode of the thin film transistor, a leakage current of the thin film transistor under the second turn-off voltage being less than a leakage current of the thin film transistor under the first turn-off voltage.

In the duration of holding the current display, by providing the second turn-off voltage to the gate electrode of the thin film transistor, the leakage current is reduced while controlling all the thin film transistors in the display panel to be turned off, and the charge loss of the pixel electrodes is reduced, thereby preventing the situation that the display brightness decreases gradually in the duration of holding the current display, and preventing display abnormalities during the ESD test.

Figure 17:
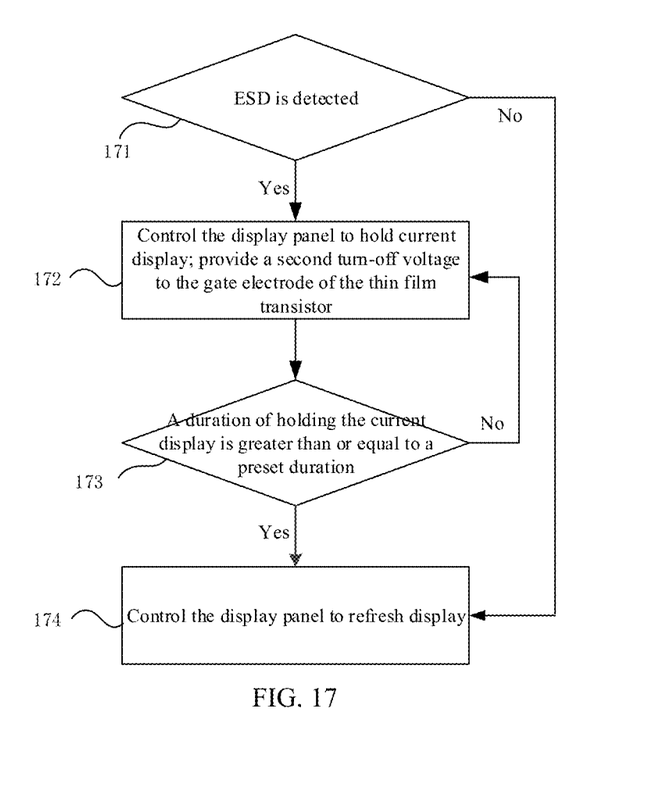
FIG. 17 is a schematic flowchart of a driving method provided in the present disclosure.

Referring to FIG. 17, a flowchart illustrating steps of a driving method of a display module is shown. As shown in FIG. 17, the driving method may include:

step 171: determining whether ESD is detected or not; if yes, performing step 172, and if no, performing step 174;

step 172: controlling the display panel to hold current display, and providing a second turn-off voltage to the gate electrode of the thin film transistor;

step 173: determining whether a duration of holding current display is greater than or equal to a preset duration or not; if yes, performing step 174, and if no, performing step 172;

step 174: controlling the display panel to refresh display.

The embodiments of the description are described in the mode of progression, each of the embodiments emphatically describes the differences from the other embodiments, and the same or similar parts of the embodiments may refer to each other.

Finally, it should also be noted that, in the present text, relation terms such as first and second are merely intended to distinguish one entity or operation from another entity or operation, and that does not necessarily require or imply that those entities or operations have therebetween any such actual relation or order. Furthermore, the terms "include", "including" or any variants thereof are intended to cover non-exclusive inclusions, so that processes, methods, articles or devices that include a series of elements do not only include those elements, but also include other elements that are not explicitly listed, or include the elements that are inherent to such processes, methods, articles or devices. Unless further limitation is set forth, an element defined by the wording "comprising a . . . " does not exclude additional same element in the process, method, article or device comprising the element.

A printed circuit board, a display module and a driving method thereof, and a display device according to the present disclosure have been described in detail above. The principle and the embodiments of the present disclosure are described herein with reference to the particular examples, and the description of the above embodiments is merely intended to facilitate to understand the method according to the present disclosure and its core concept. Moreover, for those skilled in the art, according to the concept of the present disclosure, the particular embodiments and the range of application may be varied. In conclusion, the contents of the description should not be understood as limiting the present disclosure.

Those skilled in the art, after considering the description and implementing the invention disclosed herein, will readily envisage other embodiments of the present disclosure. The present disclosure aims at encompassing any variations, uses or adaptative alternations of the present disclosure, wherein those variations, uses or adaptative alternations follow the general principle of the present disclosure and include common knowledge or common technical means in the art that are not disclosed by the present disclosure. The description and the embodiments are merely deemed as exemplary, and the true scope and spirit of the present disclosure are presented by the following claims.

It should be understood that the present disclosure is not limited to the accurate structure that is described above and shown in the drawings, and may have various modifications and variations without departing from its scope. The scope of the present disclosure is merely limited by the appended claims.

The "one embodiment", "an embodiment" or "one or more embodiments" as used herein means that particular features, structures or characteristics described with reference to an embodiment are included in at least one embodiment of the present disclosure. Moreover, it should be noted that here an example using the wording "in an embodiment" does not necessarily refer to the same one embodiment.

The description disposed herein describes many concrete details. However, it may be understood that the embodiments of the present disclosure may be implemented without those concrete details. In some of the embodiments, well-known processes, structures and techniques are not described in detail, so as not to affect the understanding of the description.

In the claims, any reference signs between parentheses should not be construed as limiting the claims. The word "include" does not exclude elements or steps that are not listed in the claims. The word "a" or "an" preceding an element does not exclude the existing of a plurality of such elements. The present disclosure may be implemented by means of hardware comprising several different elements and by means of a properly programmed computer. In unit claims that list several devices, some of those devices may be embodied by the same item of hardware. The words first, second, third and so on do not denote any order. Those words may be interpreted as names.

Finally, it should be noted that the above embodiments are merely intended to explain the technical solutions of the present disclosure, and not to limit them. Although the present disclosure is explained in detail with reference to the above embodiments, a person skilled in the art should understand that he may still modify the technical solutions set forth by the above embodiments, or make equivalent substitutions to part of the technical features of them. However, those modifications or substitutions do not make the essence of the corresponding technical solutions depart from the spirit and scope of the technical solutions of the embodiments of the present disclosure.

The invention claimed is:

1. A printed circuit board, comprising a blank area and an encapsulation area, and the printed circuit board comprises:
a first metal layer, wherein the first metal layer comprises:
a first metal pattern and a second metal pattern separated from each other; a first pad connected to the first metal pattern; and a second pad connected to the second metal pattern;
wherein the first metal pattern is located in the blank area, and the second metal pattern is located in the encapsulation area; the first pad and the second pad are configured to be connected to an electrostatic isolation device, and the second metal pattern is configured to be connected to a functional electronic device.

2. The printed circuit board according to claim 1, wherein the first pad and the second pad are both located in the encapsulation area.

3. The printed circuit board according to claim 2, wherein the blank area is separated from the encapsulation area by a boundary area, and the first pad is arranged at a position, in the encapsulation area, close to the boundary area to shorten a charge transfer path between the first metal pattern and the first pad.

4. The printed circuit board according to claim 1, wherein the first pad is located in the blank area, and the second pad is located in the encapsulation area;

wherein the blank area is separated from the encapsulation area by a boundary area, the first pad is arranged at a position, in the blank area, close to the boundary area, and the second pad is arranged at a position, in the encapsulation area, close to the boundary area.

5. The printed circuit board according to claim 1, wherein the first pad and the second pad are both located in the blank area.

6. The printed circuit board according to claim 1, wherein the first metal layer further comprises:
a first metal wire connected between the first metal pattern and the first pad, the first metal pattern, the first pad and the first metal wire forming an integrated structure; and
a second metal wire connected between the second metal pattern and the second pad, the second metal pattern, the second pad and the second metal wire forming an integrated structure.

7. The printed circuit board according to claim 6, wherein the electrostatic isolation device comprises a plurality of electronic elements; the first pad comprises a plurality of first sub-pads, and the plurality of first sub-pads are configured to be connected to first ends of different electronic elements, respectively;
wherein the plurality of first sub-pads are connected to each other, and the plurality of first sub-pads are connected to the first metal pattern through a same first metal wire; or, the plurality of first sub-pads are separated from each other, and the plurality of first sub-pads are connected to the first metal pattern through different first metal wires, respectively.

8. The printed circuit board according to claim 6, wherein the electrostatic isolation device comprises a plurality of electronic elements; the second pad comprises a plurality of second sub-pads, and the plurality of second sub-pads are configured to be connected to second ends of different electronic elements, respectively;
wherein the plurality of second sub-pads are connected to each other, and the plurality of second sub-pads are connected to the second metal pattern through a same second metal wire; or, the plurality of second sub-pads are separated from each other, and the plurality of the second sub-pads are connected to the second metal pattern through different second metal wires, respectively.

9. The printed circuit board according to claim 1, wherein the electrostatic isolation device comprises one of the following electronic elements or more than one of the following electronic elements connected in parallel: a capacitor, a resistor, and a magnetic bead.

10. The printed circuit board according to claim 1, wherein a size of the first metal pattern is greater than or equal to 5 mm and less than or equal to 15 mm in a plane where the first metal layer is located.

11. The printed circuit board according to claim 1, wherein the first metal layer comprises a plurality of first metal patterns, a plurality of first pads and a plurality of second pads;
wherein the plurality of first metal patterns and the second metal pattern are separated from each other; the plurality of first metal patterns are correspondingly connected to different first pads, respectively; the second pads are arranged in correspondence with the first pads, and a second pad and a first pad that are arranged in correspondence are connected to the same electrostatic isolation device.

12. The printed circuit board according to claim 11, wherein the first metal layer comprises two first metal patterns, the two first metal patterns are both arranged close to a first side edge of the printed circuit board, and the two first metal patterns are also arranged close to a second side edge and a third side edge of the printed circuit board, respectively;
wherein the second side edge and the third side edge are oppositely arranged, and both perpendicular to the first side edge.

13. The printed circuit board according to claim 1, further comprising:
an insulation layer arranged on a side of the first metal layer; and
a second metal layer arranged on a side of the insulation layer away from the first metal layer, wherein the second metal layer comprises a third metal pattern and a fourth metal pattern separated from each other, the third metal pattern being located in the blank area, and the fourth metal pattern being located in the encapsulation area;
wherein the first metal pattern and the third metal pattern are connected via a first through hole provided in the insulation layer; the second metal pattern and the fourth metal pattern are connected via a second through hole provided in the insulation layer.

14. A display module, comprising a display panel and a printed circuit board, wherein the printed circuit board comprises a blank area and an encapsulation area, and comprises a first metal layer, wherein the first metal layer comprises: a first metal pattern and a second metal pattern separated from each other; a first pad connected to the first metal pattern; and a second pad connected to the second metal pattern; wherein the first metal pattern is located in the blank area, and the second metal pattern is located in the encapsulation area; the first pad and the second pad are configured to be connected to an electrostatic isolation device, and the second metal pattern is configured to be connected to a functional electronic device;
wherein the printed circuit board is connected to the display panel, and is configured to provide a driving signal to the display panel, the driving signal being used for driving the display panel to display a picture.

15. The display module according to claim 14, wherein the display module further comprises a backlight plate arranged on a backlight surface of the display panel;
wherein the printed circuit board is located on a side of the backlight plate away from the display panel, and conductive foam is provided between the blank area of the printed circuit board and the backlight plate, and is configured to electrically connect the first metal pattern to the backlight plate.

16. A display device, comprising the display module according to claim 14.

17. The display device according to claim 16, wherein the display device further comprises:
a housing arranged on a side of the backlight plate away from the display panel; and
a conductive screw for fixing the backlight plate and the housing.

* * * * *